US012774790B2

(12) United States Patent
Van Bommel et al.

(10) Patent No.: US 12,774,790 B2
(45) Date of Patent: Oct. 27, 2026

(54) LED FILAMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 19/148,151

(22) PCT Filed: Jan. 10, 2024

(86) PCT No.: PCT/EP2024/050449
§ 371 (c)(1),
(2) Date: Jul. 15, 2025

(87) PCT Pub. No.: WO2024/153507
PCT Pub. Date: Jul. 25, 2024

(65) Prior Publication Data

US 2026/0227038 A1 Aug. 6, 2026

(30) Foreign Application Priority Data

Jan. 16, 2023 (EP) .................................... 23151651

(51) Int. Cl.
*F21K 9/232* (2016.01)
*F21K 9/23* (2016.01)
(Continued)

(52) U.S. Cl.
CPC ................ *F21K 9/232* (2016.08); *F21K 9/64* (2016.08); *F21K 9/23* (2016.08); *F21K 9/62* (2016.08);
(Continued)

(58) Field of Classification Search
CPC .... F21Y 2113/10; F21Y 2113/13; F21K 9/23; F21K 9/232; F21K 9/62; F21K 9/64;
(Continued)

(56) References Cited

U.S. PATENT DOCUMENTS

2010/0109036 A1* 5/2010 Chen .................... H10H 20/856
257/98
2020/0303356 A1* 9/2020 Li ........................ C09K 11/617
2022/0390073 A1* 12/2022 Weijers .................. F21K 9/232

FOREIGN PATENT DOCUMENTS

CN 215892013 U 2/2022
WO 2021018646 A1 2/2021
(Continued)

*Primary Examiner* — Colin J Cattanach

(57) ABSTRACT

The present invention relates to an LED filament (10) comprising: an at least partially light-transmissive elongated carrier (14); first LEDs (20) configured to emit first LED light (22) and distributed along the carrier on a first surface thereof; a first elongated translucent layer (26) comprising a first luminescent material arranged to at least partly convert said first LED light into first converted light (28); an elongated reflective layer (30) arranged to at least partially cover said first elongated translucent layer, such that at least part of said first converted light is transmitted through said at least partially light-transmissive elongated carrier; and second LEDs (32a-c) configured to emit second LED light (34) and distributed along the carrier on a second surface thereof, wherein the second LEDs comprise blue LEDs (32a), green LEDs (32b), and red LEDs (32c); wherein said second surface of the carrier is free from an encapsulant or comprises an encapsulant (38) being free from a luminescent material.

12 Claims, 8 Drawing Sheets

(51) Int. Cl.

| | |
|---|---|
| ***F21K 9/62*** | (2016.01) |
| ***F21K 9/64*** | (2016.01) |
| ***F21K 9/68*** | (2016.01) |
| ***F21V 7/00*** | (2006.01) |
| ***F21Y 107/90*** | (2016.01) |
| ***F21Y 109/00*** | (2016.01) |
| ***F21Y 113/10*** | (2016.01) |
| ***F21Y 113/13*** | (2016.01) |
| ***F21Y 113/17*** | (2016.01) |
| ***F21Y 115/10*** | (2016.01) |
| ***H10H 20/833*** | (2025.01) |
| ***H10H 20/851*** | (2025.01) |
| ***H10H 20/853*** | (2025.01) |
| ***H10H 20/854*** | (2025.01) |
| ***H10H 20/855*** | (2025.01) |
| ***H10H 20/856*** | (2025.01) |
| ***H10H 29/01*** | (2025.01) |
| ***H10H 29/24*** | (2026.01) |
| *H10H 20/852* | (2025.01) |

(52) U.S. Cl.

CPC ............... *F21K 9/68* (2016.08); *F21V 7/0008* (2013.01); *F21V 7/0016* (2013.01); *F21Y 2107/90* (2016.08); *F21Y 2109/00* (2016.08); *F21Y 2113/10* (2016.08); *F21Y 2113/13* (2016.08); *F21Y 2113/17* (2016.08); *F21Y 2115/10* (2016.08); *H10H 20/833* (2025.01); *H10H 20/851* (2025.01); *H10H 20/8511* (2025.01); *H10H 20/8512* (2025.01); *H10H 20/8513* (2025.01); *H10H 20/8514* (2025.01); *H10H 20/852* (2025.01); *H10H 20/853* (2025.01); *H10H 20/854* (2025.01); *H10H 20/855* (2025.01); *H10H 20/856* (2025.01); *H10H 29/0361* (2025.01); *H10H 29/24* (2025.01)

(58) Field of Classification Search

CPC ............. H10H 20/851; H10H 20/8511; H10H 20/8512; H10H 20/8513; H10H 20/852; H10H 20/853; H10H 20/854; H10H 29/0361; F21V 7/0008

See application file for complete search history.

(56) References Cited

FOREIGN PATENT DOCUMENTS

| | | | |
|---|---|---|---|
| WO | 2021094257 | A1 | 5/2021 |
| WO | 2022144252 | A1 | 7/2022 |
| WO | 2022207603 | A1 | 10/2022 |
| WO | 2022248283 | A1 | 12/2022 |

* cited by examiner

LED FILAMENT

CROSS-REFERENCE TO PRIOR APPLICATIONS

This application is the U.S. National Phase application under 35 U.S.C. § 371 of International Application No. PCT/EP2024/050449, filed on Jan. 10, 2024, which claims the benefit of European Patent Application No. 23151651.9, filed on Jan. 16, 2023. These applications are hereby incorporated by reference herein.

FIELD OF THE INVENTION

The present invention relates to light-emitting diode (LED) filament. The present invention also relates to an LED filament arrangement comprising such an LED filament. The present invention also relates to a lamp or a luminaire comprising such an LED filament arrangement. The present invention also relates to a lighting system comprising such a lamp or luminaire.

BACKGROUND OF THE INVENTION

A trend in lighting is LED filament lamps. An LED filament lamp is an LED lamp which is designed to resemble a traditional incandescent light bulb with a visible filament for aesthetic and light distribution purposes, but with the high efficiency of light-emitting diodes.

CN215892013U discloses a multi-color-temperature RGB flexible lamp filament comprises a substrate and LED wafers, substrate circuits are laid on the two faces of the substrate, the substrate circuits are laid in the length direction of the substrate, the two faces of the substrate are each provided with a plurality of substrate circuits, the substrate circuits are provided with a plurality of LED wafers, and the LED wafers are arranged on the substrate circuits. The LED wafer comprises a white light wafer and an RGB wafer, the multi-color-temperature RGB lamp comprises a driving assembly and a multi-color-temperature RGB lamp filament, the multi-color-temperature RGB lamp filament is spirally arranged around the core column, a metal guide rod is arranged above the core column, a metal wire is arranged below the core column, and the driving assembly is arranged at the lowest part of the lamp shell. The color temperature adjusting area and the color adjusting area are arranged on the two faces of the substrate respectively.

In WO 2022/207603 the invention provides an LED filament device comprising a first LED filament side, a second LED filament side, an intermediate layer, and (iv) a plurality of sources of light, wherein: first sources of light are configured to generate first white light having a first correlated color temperature CCT1; wherein the first sources of light are associated to the first filament side; second sources of light are configured to generate second white light having a second correlated color temperature CCT2; wherein the second sources of light are associated to the first filament side; wherein CCT2−CCT1 greater than or equal to 500 K.

WO 2021/094257 provides a LED filament lamp. The LED filament comprises a first linear array of LEDs and a second linear array of LEDs, and a carrier. The first linear array of LEDs is arranged on a first surface of the carrier and includes only first LEDs which are configured to emit first white light. The second linear array of LEDs are arranged on a second surface of the carrier. The LED filament light comprises the first white light and/or the color controllable light.

WO 2022/144252 discloses LED filament comprising a plurality of LEDs, wherein the LED filament comprises a center axis, A, and elongates in a meandering shape in a first plane, P, wherein a first portion of the LED filament, which elongates along the center axis, A, comprises an array of the plurality of LEDs and an encapsulant at least partially enclosing the array of the plurality of LEDs, and a second portion of the LED filament, which elongates along the center axis, A, comprises a distribution of LEDs of the plurality of LEDs, and wherein the first portion and the second portion of the LED filament are arranged on opposite sides with respect to the first plane, P.

WO 2022/248283 discloses LED filament arranged to emit LED filament light is provided. The LED filament comprises a LED filament, elongating along an axis, A, comprising array(s) of a plurality of LEDs arranged to emit LED light, and an encapsulant enclosing the array(s) of the LEDs, wherein the encapsulant comprises a light-transmissive material. The LED filament further comprises an elongated reflector.

SUMMARY OF THE INVENTION

It is an object of the present invention to improve performance and/or functionality of LED filaments.

According to a first aspect of the invention, this and other objects are achieved by a light-emitting diode (LED) filament configured to provide LED filament light and comprising: an at least partially light-transmissive elongated carrier, wherein said elongated carrier comprises two elongated edge portions arranged at a distance from each other, a first major surface, and a second major surface arranged opposite to said first major surface, said first and second major surfaces being delimited by said edge portions; a plurality of first LEDs distributed along said elongated carrier on said first major surface of said elongated carrier, the plurality of first LEDs being configured to emit first LED light; a first elongated translucent layer encapsulating (or covering) said plurality of first LEDs and at least partially covering said first major surface of said elongated carrier, wherein said first elongated translucent layer comprises a first luminescent material, and wherein said first luminescent material is arranged to at least partly convert said first LED light into first converted light; an elongated reflective layer arranged to at least partially cover said first elongated translucent layer, such that at least part of said first converted light is transmitted through said at least partially light-transmissive elongated carrier; and a plurality of second LEDs distributed along said elongated carrier on said second major surface of said elongated carrier, the plurality of second LEDs being configured to emit second LED light, wherein said plurality of second LEDs comprises a plurality of blue LEDs adapted to emit blue light, a plurality of green LEDs adapted to emit green light, and a plurality of red LEDs adapted to emit red light; wherein said second major surface of said elongated carrier is free from an encapsulant or comprises an encapsulant being free from a luminescent material.

The present LED filament is slim (i.e. has a small width) and provides colored and white light in a homogenous way without crosstalk. In operation the filament may emit red, green, and blue light as well as white light, all in one direction.

Compared to the aforementioned CN215892013U, CN215892013U at least fails to disclose an elongated carrier which is at least partially light-transmissive, and an elongated reflective layer arranged such that at least part of converted light is transmitted through the carrier. A technical effect of these differences is that the present LED filament may provide colored and white light in a homogenous way.

In case said second major surface of said elongated carrier comprises an encapsulant, said encapsulant is preferably free from a light scattering material. This provides for no backscattering of blue light in a direction to the (first) luminescent material. That is, a light scattering material could scatter some of the blue light back, which back scattered blue light could transmit through the light-transmissive carrier and subsequently be converted by the luminescent material; this is indeed undesired.

Said first LED light emitted by said plurality of first LEDs may have a dominant peak wavelength in a wavelength range from 420 to 490 nm, wherein said first luminescent material comprises a green-yellow phosphor (and red phosphor), and wherein said first converted light comprises green-yellow converted light (and red converted light). In this way, the LED filament may provide (warm) white light, especially white light of a high light quality (due to phosphor emission which is e.g. broad band light emission), especially white light having a CRI of at least 80, preferably at least 85.

The LED filament may further comprise: a plurality of third LEDs distributed along said elongated carrier on said first major surface of said elongated carrier, the plurality of third LEDs being configured to emit third LED light; and a second elongated translucent layer (encapsulating or) covering said plurality of third LEDs and at least partially covering said first major surface of said elongated carrier, wherein said second elongated translucent layer comprises a second luminescent material, wherein said second luminescent material is arranged to at least partly convert said third LED light into second converted light, and wherein said first converted light has a first spectral light distribution and said second converted light has a second spectral light distribution different from said first spectral light distribution, wherein said elongated reflective layer is arranged to at least partially encapsulate or cover said second elongated translucent layer, such that at least part of said second converted light is transmitted through said at least partially light-transmissive elongated carrier. In this way, the LED filament may provide different white light, such as (alternatingly) warm white light and cool white light, or combinations thereof.

Said elongated reflective layer may be arranged between said first elongated translucent layer and said second elongated translucent layer. In this way, crosstalk between the first elongated translucent layer and the second elongated translucent layer may be reduced or avoided. And emission mainly from one side of the LED filament may be provided. Preferably, said first elongated translucent layer is fully separated from said second elongated translucent layer by said elongated reflective layer.

Said elongated reflective layer may comprise at least partially light-reflective particles dispersed in a polymer matrix. Said elongated reflective layer may for example have a reflectivity of at least 70%. Furthermore, said LED filament may be flexible. In this way, the LED filament may readily be provided in a non-straight configuration, such as for example a curved configuration, a 2D/3D spiral, or a helix. That is, the LED filament may be arranged in different shapes while the reflection is high.

In embodiments, said elongated reflective layer may have a reflectivity of at least 70%, more preferably at least 80%, most preferably at least 85%, such as for example 88%. The higher the reflectivity, the higher the efficiency of the LED filament and thus the LED filament lamp or luminaire. Preferably, less than 20%, especially less than 10% or less than 5% of the first LED light and/or converted light is transmitted through the elongated reflective layer. In embodiments, the elongated reflective layer may cover at least 80%, especially at least 90% or 95% of the first elongated translucent layer.

Said elongated reflective layer may be configured such that at least 60% (preferably at least 80%, most preferably at least 85%) of said LED filament light excluding said second LED light is transmitted through said at least partially light-transmissive elongated carrier.

Said elongated reflective layer may have a substantially U-shaped or W-shaped cross section. The U-shaped cross section is applicable in case the LED filament only comprises the first elongated translucent layer, and the W-shaped cross section is applicable in case the LED filament comprises both the first elongated translucent layer and the second elongated translucent layer.

Said plurality of blue LEDs, said plurality of green LEDs, and said plurality of red LEDs may be arranged in a first single column. In this way, the blue, green, and red LEDs may not block (so much of) the converted light transmitted through the elongated carrier, and/or it provides for a slim (thin) LED filament design. Accordingly, in case said elongated reflective layer has a substantially W-shaped cross section, said first single column may be parallel to and overlapping with a central portion of said W-shaped cross section of said elongated reflective layer. Instead of being arranged in a first single column, said plurality of blue LEDs may be arranged in a first column, said plurality of green LEDs may be arranged in a second first column, and said plurality of red LEDs may be arranged in a third first column, which first columns are parallel to each other.

The plurality of first LEDs may be arranged in a second single column, and the plurality of third LEDs may be arranged in a third single column. This provides for a slim LED filament, which nevertheless can provide different white light in a homogenous way. According to a second aspect of the invention, there is provided an LED filament arrangement comprising an LED filament according to the first aspect and a controller, wherein said controller is configured to individually control said plurality of first LEDs, said plurality of blue LEDs, said plurality of green LEDs, said plurality of red LEDs, and optionally said plurality of third LEDs. In this way, different colored light, white light, and optionally different white light can be provided. Furthermore, the LED filament can provide blue light without exciting the luminescent material. Thus blue light of the blue LEDs on the second major surface is directed away from the luminescent material. Accordingly, the controller may be configured to individually control the LEDs such that in a first operational mode the LED filament light is (only) blue light, in a second operational mode the LED filament light is (only) green light, in a third operational mode the LED filament light is (only) red light, and in a fourth operational mode the LED filament light is (only) white light.

According to a third aspect of the invention, there is provided a lamp or a luminaire comprising an LED filament arrangement according to the second aspect and an antenna functionally coupled to said controller. The antenna allows the lamp or luminaire to be remotely controlled. The lamp could for example be a (retrofit) bulb.

According to a fourth aspect of the invention, there is provided a lighting system comprising a lamp or luminaire according to the third aspect and further comprising one or more (remote) user interfaces for providing user input and/or one or more (remote) sensors for sensing data, wherein the controller is configured to control said plurality of first LEDs, said plurality of blue LEDs, said plurality of green LEDs, said plurality of red LEDs, and optionally said plurality of third LEDs based on said user input and/or said (sensed) data. It is noted that the invention relates to all possible combinations of features recited in the claims.

BRIEF DESCRIPTION OF THE DRAWINGS

These and other aspects of the present invention will now be described in more detail, with reference to the appended drawings showing embodiments of the invention.

As illustrated in the figures, the sizes of layers and regions may be exaggerated for illustrative purposes and, thus, are provided to illustrate the general structures of embodiments of the present invention. Like reference numerals refer to like elements throughout.

DETAILED DESCRIPTION

Figure 1A:
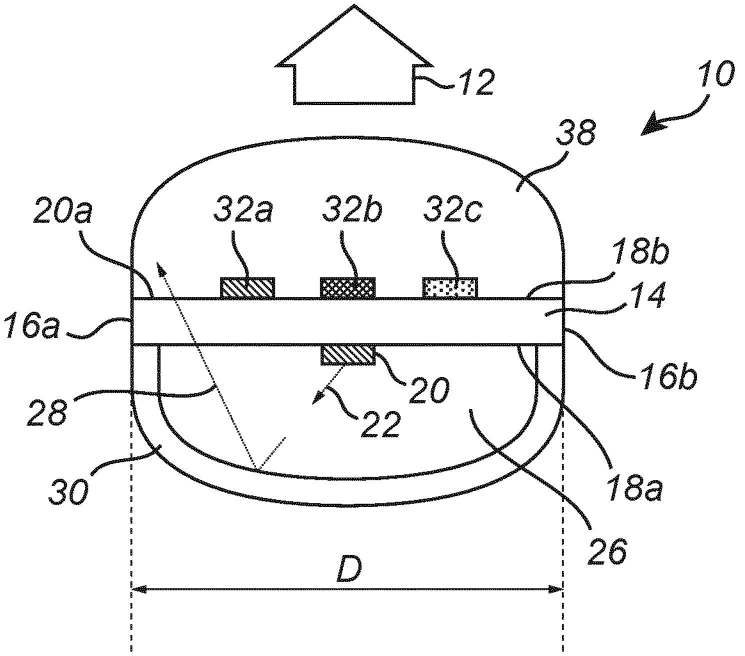
FIG. 1*a* is a cross-sectional view of an LED filament according to an embodiment of the invention.
Figure 1B:
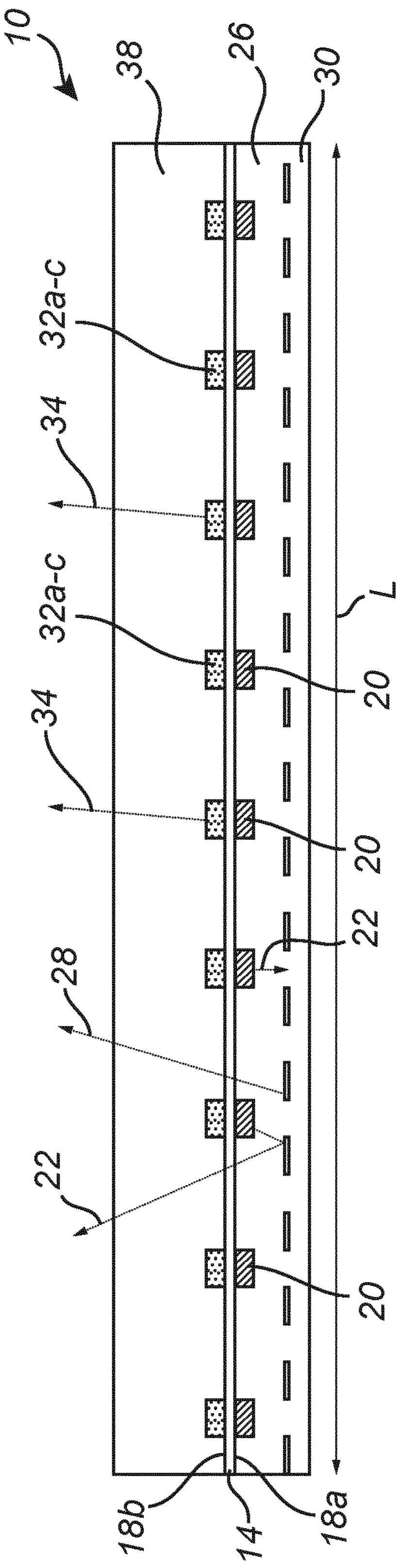
FIG. 1*b* is a side view of the LED filament of FIG. 1*a*.
Figure 1C:
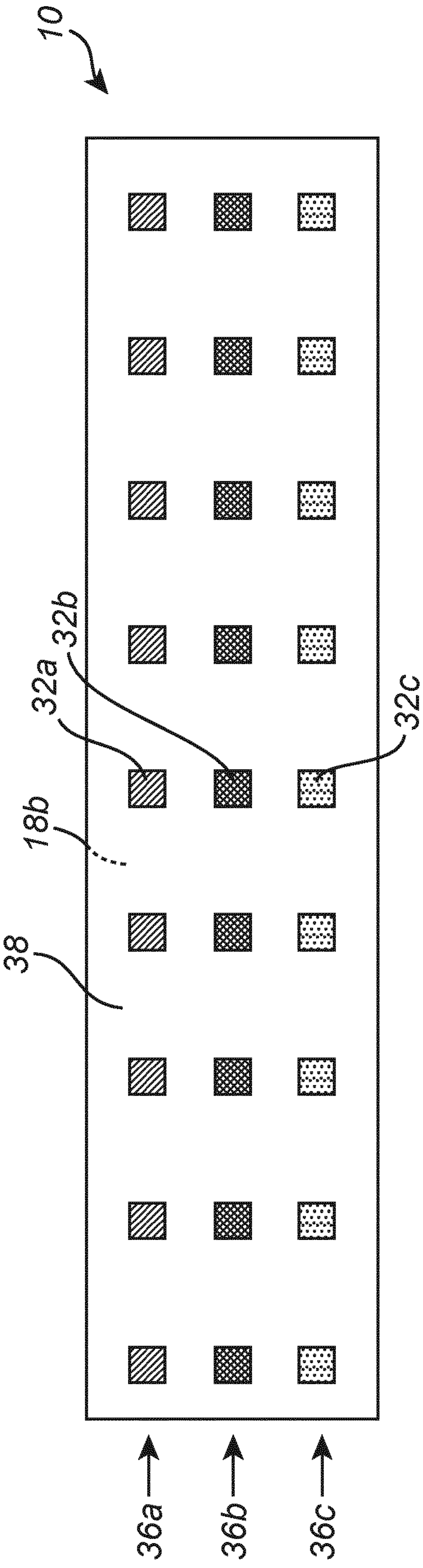
FIG. 1*c* is a top view of the LED filament of FIG. 1*a*.
Figure 1D:
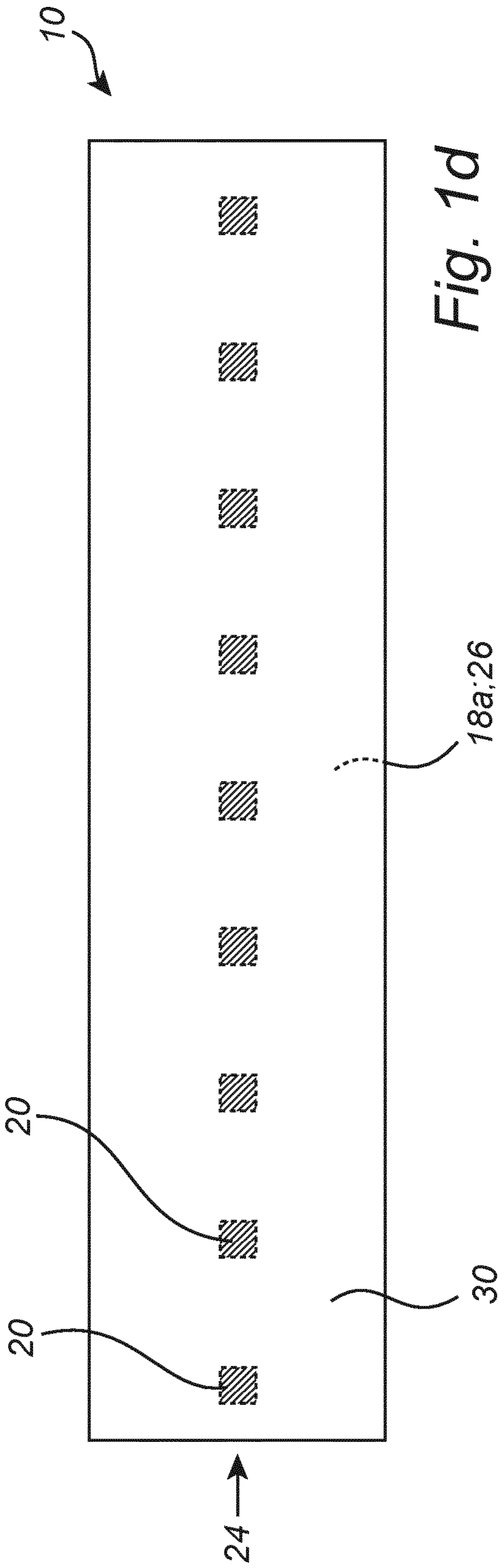
FIG. 1*d* is a bottom view of the LED filament of FIG. 1*a*.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

FIGS. 1*a-d* illustrate an LED filament 10 according to an embodiment of the invention, which LED filament 10 is configured to provide LED filament light 12. The LED filament 10 may be rigid or flexible.

The LED filament 10 comprises an elongated carrier 14. The elongated carrier 14 comprises two elongated edge portions 16*a-b* arranged at a distance D from each other, a first (major) surface 18*a*, and a second (major) surface 18*b* arranged opposite to the first surface 18*a*. The first and second surfaces 18*a-b* are delimited by the edge portions 16*a-b*. Preferably, the LED filament has a length L, wherein L>5D. The distance D, which corresponds to the width of the elongated carrier 14, may for example be in a range from 0.5 to 5 mm. The elongated carrier 14 may be flexible.

The elongated carrier 14 is at least partially light-transmissive. To this end, the elongated carrier 14 may be translucent, preferably transparent. Preferably substantially the complete elongated carrier 14 is light-transmissive. The elongated carrier 14 may for example be made of glass or a polymer. The elongated carrier 14 may for example be a printed circuit board (PCB).

The LED filament 10 further comprises a plurality of first LEDs 20 distributed along the elongated carrier 14, on the first surface 18*a* thereof. The plurality of first LEDs 20 are configured to emit first LED light 22. The first LEDs 20 may for example be or comprise violet and/or (further) blue LEDs, and the first LED light 22 may be violet and/or blue first LED light 22. Specifically, the first LED light 22 may have a dominant peak wavelength in a wavelength range from 420 to 490 nm. Furthermore, the plurality of first LEDs 20 are preferably arranged in a single column 24, here on the longitudinal centerline of the elongated carrier 14. The number of first LEDs 20 may for example be at least ten or at least twenty first LEDs 20.

The LED filament 10 further comprises a first elongated translucent layer 26 encapsulating or covering the plurality of first LEDs 20. The first elongated translucent layer 26 also at least partially encapsulates or covers the first surface 18*a* of the elongated carrier 14. The first elongated translucent layer 26 comprises a first luminescent material arranged to at least partly convert the first LED light 22 into first converted light 28. The first luminescent material may be a phosphor, such as a green-yellow phosphor and optionally red phosphor, whereby the first converted light 28 may comprise green-yellow converted light and optionally red converted light. The first converted light 28 in combination with unconverted first LED light 22 may result in light perceived as (warm) white.

The LED filament 10 further comprises an elongated reflective layer 30 arranged to at least partially (preferably completely) encapsulate or cover the first elongated translucent layer 26. The elongated reflective layer 30 is arranged such that at least part of the first converted light 28 in operation of the LED filament 10 is transmitted through the at least partially light-transmissive elongated carrier 14. Specifically, the elongated reflective layer 30 may be configured to reflect first converted light 28, such that at least part of the first converted light 28 is transmitted through the at least partially light-transmissive elongated carrier 14. The elongated reflective layer 30 may also reflect any unconverted first LED light 22, such that at least part of such unconverted first LED light 22 is transmitted through the at least partially light-transmissive elongated carrier 14.

The elongated reflective layer 30 here has a substantially U-shaped cross section, with respect to the width of the LED filament 10, as exemplarily illustrated in FIG. 1*a*. The U-shaped cross section may be uniform throughout the (complete) length of the elongated reflective layer 30.

Furthermore, the elongated reflective layer 30 may comprises at least partially light-reflective particles dispersed in a polymer matrix, for example aluminium flakes in a silicone. The elongated reflective layer 30 may have a reflectivity of at least 70%. The LED filament 10 further comprises a plurality of LEDs 32*a-c* distributed along the elongated carrier 14, on the second surface 18*b* of the elongated carrier 14. The plurality of second LEDs 32*a-c* are configured to emit second LED light 34, for example colored second LED light 34. To this end, the plurality of second LEDs may comprise a plurality of blue LEDs 32*a* for emitting blue light, a plurality of green LEDs 32*b* for emitting green light, and a plurality of red LEDs 32*c* for emitting red light. For example, the blue LEDs 32*a* may be arranged in a first column 36*a*, the green LEDs 32*b* may be arranged in a second column 36*b*, and the red LEDs 32*c* may be arranged in a third first column 36*c*, which columns 36*a-c* are parallel to each other, as shown in particular in FIG. 1*c*. Furthermore, the plurality of second LEDs 32*a-c*/second LED light 34 is (generally) directed away from the elongated carrier 14. The number of second LEDs 32*a-c* may for example be at least ten or at least twenty second LEDs 32*a-c*.

The LED filament 10 may comprises an encapsulant 38 encapsulating or covering the plurality of second LEDs 32*a-c* and at least partially encapsulating or covering the first surface 18*b* of the elongated carrier 14. However, this encapsulant 38 free from a luminescent material. In other words, the encapsulant 38 does not comprise any luminescent material. The encapsulant 38 is preferably also free from a light scattering material. The encapsulant 38 may for example be transparent. The encapsulant 38 may for example be made of silicone. Alternatively, the LED filament 10 may have no encapsulant at all (not shown) over the second LEDs 32*a-c*.

In operation of the LED filament 10, at least some of the first LEDs 20 are on and emit the first LED light 22, and/or at least some the second LEDs 32*a-c* are on and emit the second LED light 34 (typically colored light). The first luminescent material of the first elongated translucent layer 26 at least partly converts the first LED light 22 into the first converted light 28, wherein at least part of the first converted light 28 is transmitted through the at least partially light-transmissive elongated carrier 14 (due to the elongated reflective layer 30). Also unconverted first LED light 22 may be transmitted through the elongated carrier 14, after reflection by the elongated reflective layer 30. The first converted light 28, any unconverted first LED light 22, and the second LED light 34 may form the aforementioned LED filament light 12. Preferably the elongated reflective layer 30 is configured such that at least 60% of the LED filament 12 light excluding the second LED light 34 is transmitted through the at least partially light-transmissive elongated carrier 14.

Figure 2A:
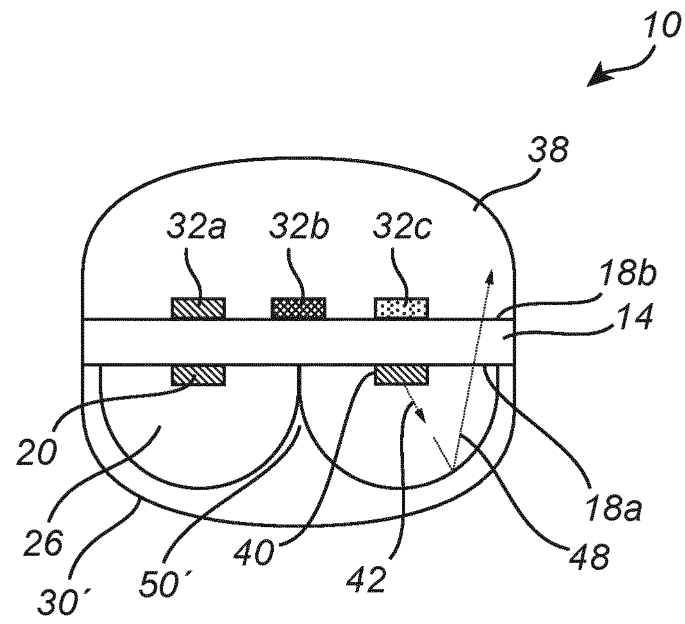
FIGS. 2*a-b* are cross-sectional views of an LED filament according to other embodiments of the invention.
Figure 2B:
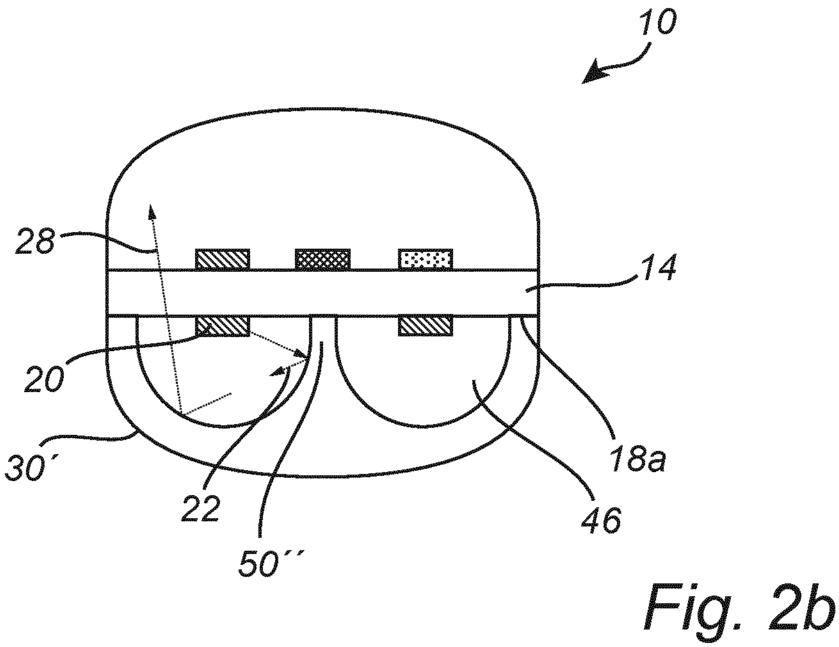
Figure 2C:
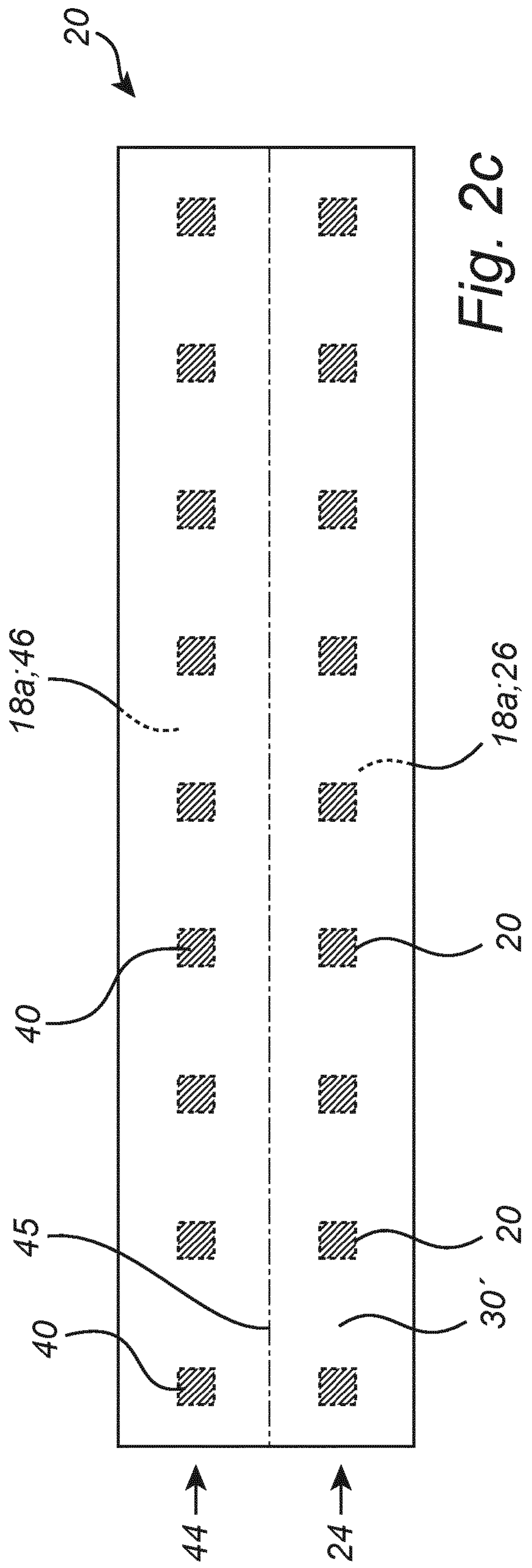
FIG. 2*c* is a bottom view of the LED filaments of FIG. 2*a-b*.

FIGS. 2*a-b* show LED filaments 10 according to other embodiments. These LED filaments are similar to the LED filament 10 of FIGS. 1*a-d*, but further comprise a plurality of third LEDs 40 distributed along elongated carrier 14 on the first surface 18*a* thereof. The plurality of third LEDs 40 are configured to emit third LED light 42. The third LEDs 40 may for example be violet or blue LEDs, and the third LED light 42 may have the same dominant peak wavelength as the first LED light 22 or a different dominant peak wavelength than the first LED light 22. Furthermore, the plurality of third LEDs 42 are preferably arranged in a single column 44 different from but parallel to the single column 24 of the plurality of first LEDs 20, on opposite sides of the longitudinal centerline 45 of the elongated carrier 14 (see FIG. 2*c*).

The LED filament 10 of FIGS. 2*a-b* further comprises a second elongated translucent layer 46 encapsulating or covering the plurality of third LEDs 40. The second elongated translucent layer 46 also partially encapsulates or covers the first surface 18*a* of the elongated carrier 14. Specifically, the second elongated translucent layer 46 encapsulates or covers approximately one half of the first surface 18*a* on one side of the longitudinal centerline of the elongated carrier 14, whereas the first elongated translucent layer 26 here encapsulates or covers the other half. The second elongated translucent layer 46 comprises a second luminescent material arranged to at least partly convert the third LED light 42 into second converted light 48 having a second spectral light distribution different from the aforementioned first spectral light distribution. The second luminescent material may be a phosphor, such as a green-yellow phosphor, whereby the second converted light 48 may comprise green-yellow converted light to provide white light having a different CCT (correlated color temperature), for example cool white light.

The elongated reflective layer 30' is in FIGS. 2*a-b* arranged to at least partially encapsulate or cover also the second elongated translucent layer 46, such that at least part of the second converted light 48 in operation of the LED filament 10 is transmitted through the at least partially light-transmissive elongated carrier 14. Specifically, the elongated reflective layer 30' may be configured to reflect second converted light 48, such that at least part of the second converted light 48 is transmitted through the at least partially light-transmissive elongated carrier 14. The elongated reflective layer 30' may also reflect any unconverted second LED light 42, such that at least part of such unconverted first LED light 42 is transmitted through the at least partially light-transmissive elongated carrier 14 as well.

The elongated reflective layer 30' here has a substantially W-shaped (double-u shaped) cross section, with respect to the width of the LED filament 10, as exemplarily illustrated in FIGS. 2*a-b*, with a central portion 50' or 50" arranged between the first elongated translucent layer 26 and the second elongated translucent layer 46. The W-shaped cross section may be uniform throughout the (complete) length of the elongated reflective layer 30'. In FIG. 2*a*, the central portion of the elongated reflective layer 30' is a tap 50' extending towards but not all the way to the elongated carrier 14. In FIG. 2*b*, the central portion of the elongated reflective layer 30' is a partition wall 50" extending all the way to the elongated carrier 14, such that the first elongated translucent layer 26 is fully separated from the second elongated translucent layer 46.

In operation of the LED filaments 10 of FIG. 2*a-b*, at least some of the first LEDs 20 may be on and emit the first LED light 22 and/or at least some of the third LEDs 40 may be on and emit the third LED light 42. Also at least some the second LEDs 32*a-c* may be on and emit the second LED light 34 (typically colored light). The first luminescent material of the first elongated translucent layer 26 at least partly converts any first LED light 22 into the first converted light 28, wherein at least part of the first converted light 28 is transmitted through the at least partially light-transmissive elongated carrier 14. Likewise, the second luminescent material of the second elongated translucent layer 46 at least partly converts any third LED light 42 into the second converted light 48, wherein at least part of the second converted light 48 is transmitted through the at least partially light-transmissive elongated carrier 14. As illustrated in FIG. 2*b*, any (unconverted) first LED light 22 is prevented from reaching the second elongated translucent layer 46 by means of the partition wall 50" of the elongated reflective layer 30'. Likewise, any (unconverted) second LED light 42 will be prevented from reaching the first elongated translucent layer 26 by means of the partition wall 50" of the elongated reflective layer 30'.

Figure 3A:
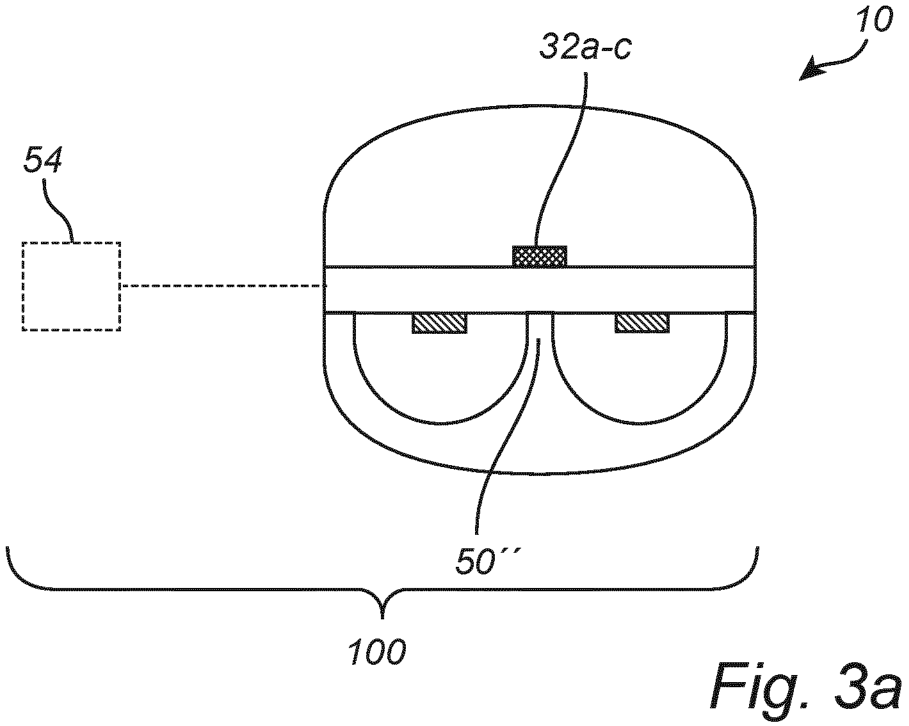
FIGS. 3*a-b* are a cross-sectional view and a top view, respectively, of an LED filament according to another embodiment of the invention.
Figure 3B:
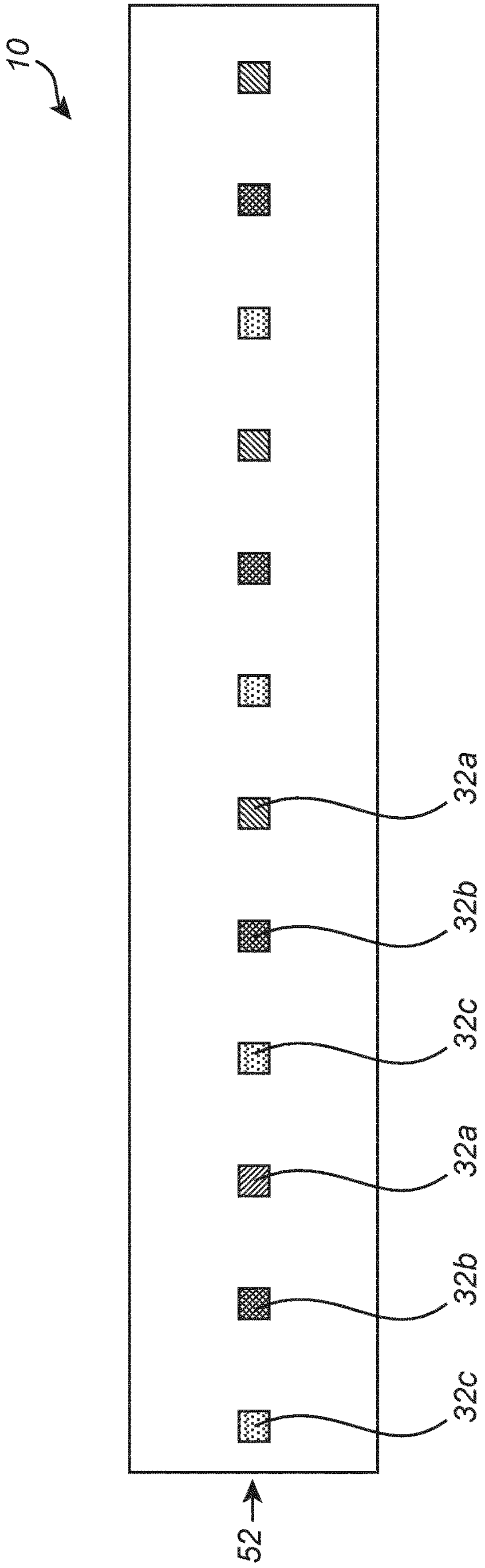

FIGS. 3*a-b* show an LED filament 10 according to another embodiment. This LED filament may be similar to the previously described LED filaments 10, but here the second LEDs, i.e. the plurality of blue LEDs 32*a*, the plurality of green LEDs 32*b*, and the plurality of red LEDs 32*c* are arranged in a single column 52, preferably on the longitudinal centerline of the elongated carrier 14. The LEDs 32*a-c* may be arranged in alternating order of color (e.g. R-G-B-R-G-B and so on, i.e. (RGB) n with n preferably ≥5) in the single column 52, although other arrangements such as batching could be possible as well. The single column 52 of second LEDs 32*a*-*b* may be parallel to and overlapping with the central portion (for example partitional wall 50", as shown in FIG. 3*a*) of the aforementioned W-shaped cross section of the elongated reflective layer 30'.

The present LED filament 10, for example the LED filament of FIG. 3*a*, may comprise or be connected to an electronic controller 54. The controller 54 is configured to individually control the plurality of first LEDs 20, the plurality of blue LEDs 32*a*, the plurality of green LEDs 32*b*, the plurality of red LEDs 32*c*, and any third LEDs 40. Specifically, the controller 54 may be configured to individually control the plurality of first LEDs 20, the plurality of blue LEDs 32*a*, the plurality of green LEDs 32*b*, the plurality of red LEDs 32*c*, and any third LEDs 40, such that in a first operational mode the LED filament light 12 is only blue light, in a second operational mode the LED filament light 12 is only green light, in a third operational mode the LED filament light 12 is only red light, and in a fourth operational mode the LED filament light 12 is only white light. The LED filament 10 and the controller 54 may together be referred to as an LED filament arrangement 100.

Figure 4:
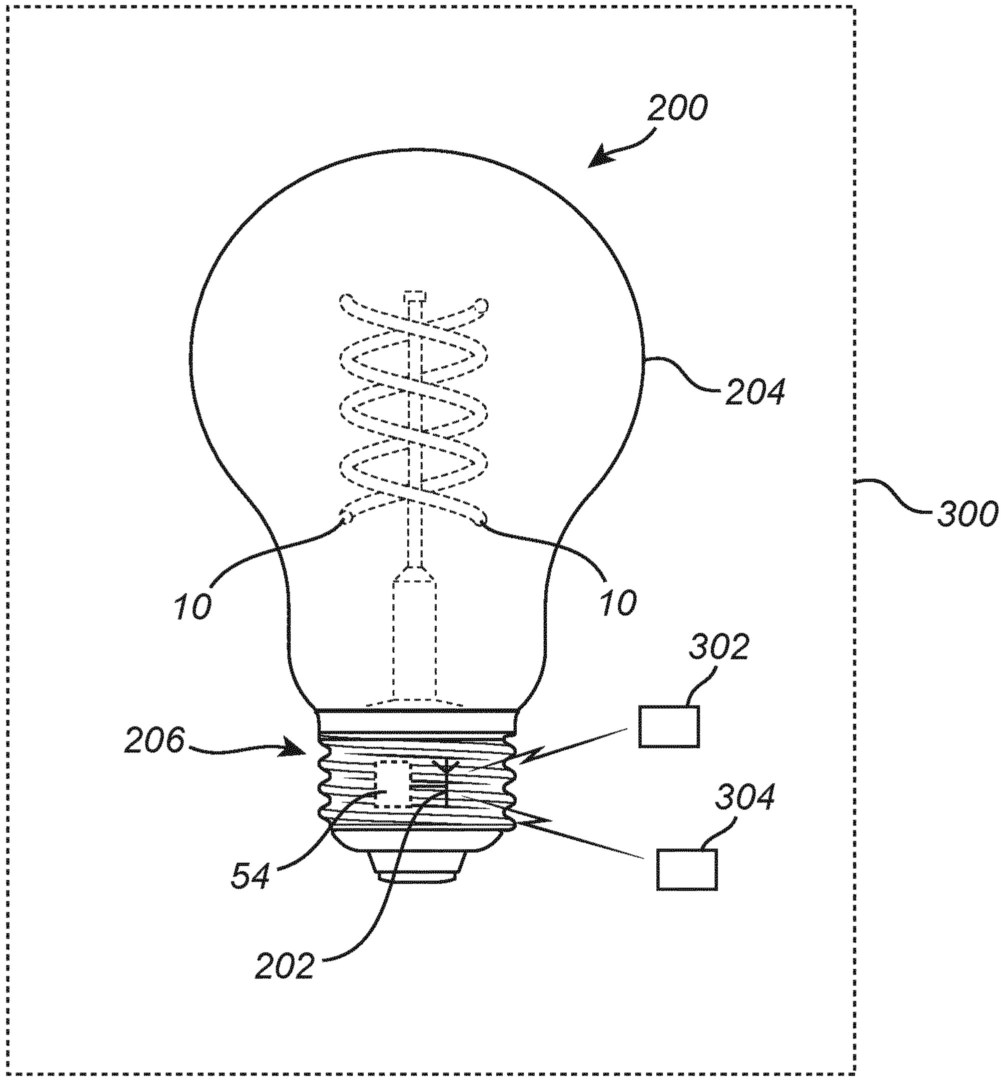
FIG. 4 is a side view of aspects of the invention including a lamp.

FIG. 4 illustrates a lamp 200 according to an aspect of the invention. The lamp 200 comprises the LED filament arrangement 100, i.e. any one of the LED filaments 10 and the controller 54, and an antenna 202 functionally coupled to the controller 54. The antenna 202 may be configured to receive user input from at least one user interface 302 and/or data from at least one sensor 304. And the controller 54 may be configured to control the first LEDs 20, the blue LEDs 32*a*, the green LEDs 32*b*, the red LEDs 32*c*, and any third LEDs 40 of the LED filament based on user input from the user interface 302 and/or (sensed) data from the at least one sensor 304. The lamp 200 and the user interface 302 and/or the sensor(s) 304 may be referred to as a lighting system 300. The user interface 302 and/or the sensor(s) 304 may be remote of the lamp 200. The user interface 302 may for example be embodied on a mobile phone. The at least one sensor 304 may for example include at least one of: a camera, a light sensor, a presence sensor, and a proximity sensor.

The LED filament 10 is here arranged in a coiled configuration, but other configurations such as a straight configuration are possible as well. The lamp 200 may further comprise an envelope 204 enclosing the filament 10, and a cap or base 206 for electrically and mechanically connecting the lamp 200 to an external socket (not shown). The lamp 200 could also have at least one additional LED filament 10. The lamp 200 may for example be a retrofit bulb.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word “comprising” does not exclude other elements or steps, and the indefinite article “a” or “an” does not exclude a plurality. The mere fact that certain measures are recited in mutually different dependent claims does not indicate that a combination of these measured cannot be used to advantage.

The invention claimed is:

1. A light-emitting diode, LED, filament configured to provide LED filament light and comprising:

an at least partially light-transmissive elongated carrier, wherein said elongated carrier comprises two elongated edge portions arranged at a distance (D) from each other, a first major surface, and a second major surface arranged opposite to said first major surface, said first and second major surfaces being delimited by said edge portions;

a plurality of first LEDs distributed along said elongated carrier on said first major surface of said elongated carrier, the plurality of first LEDs being configured to emit first LED light;

a first elongated translucent layer encapsulating said plurality of first LEDs and at least partially covering said first major surface of said elongated carrier, wherein said first elongated translucent layer comprises a first luminescent material, and wherein said first luminescent material is arranged to at least partly convert said first LED light into first converted light;

an elongated reflective layer arranged to at least partially cover said first elongated translucent layer, such that at least part of said first converted light is transmitted through said at least partially light-transmissive elongated carrier; and a plurality of second LEDs distributed along said elongated carrier on said second major surface of said elongated carrier, the plurality of second LEDs being configured to emit second LED light, wherein said plurality of second LEDs comprises a plurality of blue LEDs adapted to emit blue light, a plurality of green LEDs adapted to emit green light, and a plurality of red LEDs adapted to emit red light;

wherein said second major surface of said elongated carrier is free from an encapsulant or comprises an encapsulant being free from a luminescent material, the LED filament further comprising, a plurality of third LEDs distributed along said elongated carrier on said first major surface of said elongated carrier, the plurality of third LEDs being configured to emit third LED light; and a second elongated translucent layer encapsulating said plurality of third LEDs and at least partially covering said first major surface of said elongated carrier, wherein said second elongated translucent layer comprises a second luminescent material, wherein said second luminescent material is arranged to at least partly convert said third LED light into second converted light, and wherein said first converted light has a first spectral light distribution and said second converted light has a second spectral light distribution different from said first spectral light distribution, wherein said elongated reflective layer is arranged to at least partially encapsulate or cover said second elongated translucent layer, such that at least part of said second converted light is transmitted through said at least partially light-transmissive elongated carrier, wherein said elongated reflective layer is arranged between said first elongated translucent layer and said second elongated translucent layer and, wherein said first elongated translucent layer is fully separated from said second elongated translucent layer by said elongated reflective layer.

2. The LED filament according to claim 1, wherein said encapsulant is free from a light scattering material.

3. The LED filament according to claim 1, wherein said first LED light emitted by said plurality of first LEDs has a dominant peak wavelength in a wavelength range from 420 to 490 nm, wherein said first luminescent material comprises a green-yellow phosphor and red phosphor, and wherein said first converted light comprises green-yellow converted light and red converted light.

4. The LED filament according to claim 1, wherein said elongated reflective layer comprises at least partially light-reflective particles dispersed in a polymer matrix, wherein said elongated reflective layer has reflectivity of at least 70%, and wherein said LED filament is flexible.

5. The LED filament according to claim 1, wherein said elongated reflective layer is configured such that at least 60% of said LED filament light excluding said second LED light is transmitted through said at least partially light-transmissive elongated carrier.

6. The LED filament according to claim 1, wherein said elongated reflective layer has a substantially W-shaped cross section.

7. The LED filament according to claim 1, wherein said plurality of blue LEDs, said plurality of green LEDs, and said plurality of red LEDs are arranged in a first single column.

8. The LED filament according to claim 6, wherein said first single column is parallel to and overlapping with a central portion of said W-shaped cross section of said elongated reflective layer.

9. The LED filament according to claim 1, wherein the plurality of first LEDs are arranged in a second single column and the plurality of third LEDs are arranged in a third single column.

10. A LED filament arrangement comprising an LED filament according to claim 1 and a controller, wherein said controller is configured to individually control said plurality of first LEDs, said plurality of blue LEDs, said plurality of green LEDs, said plurality of red LEDs, and optionally said plurality of third LEDs, such that in a first operational mode the LED filament light is blue light, in a second operational mode the LED filament light is green light, in a third operational mode the LED filament light is red light, and in a fourth operational mode the LED filament light is white light.

11. A lamp or a luminaire comprising an LED filament arrangement according to claim 10 and an antenna functionally coupled to said controller.

12. A lighting system comprising a lamp or luminaire according to claim 11 and further comprising one or more remote user interfaces for providing user input and/or one or more remote sensors for sensing data, wherein the controller is configured to control said plurality of first LEDs, said plurality of blue LEDs, said plurality of green LEDs, said plurality of red LEDs, and optionally said plurality of third LEDs based on said user input and/or said data.

* * * * *